United States Patent
Cao et al.

(10) Patent No.: US 11,469,774 B2
(45) Date of Patent: Oct. 11, 2022

(54) DATA COMPRESSION METHOD AND APPARATUS, AND COMPUTER DEVICE

(71) Applicant: Beijing OceanBase Technology Co., Ltd., Beijing (CN)

(72) Inventors: Hui Cao, Zhejiang (CN); Yuzhong Zhao, Zhejiang (CN)

(73) Assignee: Beijing OceanBase Technology Co., Ltd., Beijing (CN)

( * ) Notice: Subject to any disclaimer, the term of this patent is extended or adjusted under 35 U.S.C. 154(b) by 0 days.

(21) Appl. No.: 17/357,143

(22) Filed: Jun. 24, 2021

(65) Prior Publication Data

US 2022/0014210 A1    Jan. 13, 2022

(30) Foreign Application Priority Data

Jul. 9, 2020   (CN) .......................... 202010656511.4

(51) Int. Cl.
*G06F 16/00* (2019.01)
*H03M 7/30* (2006.01)
(Continued)

(52) U.S. Cl.
CPC ........ *H03M 7/6082* (2013.01); *G06F 16/215* (2019.01); *G06F 16/2282* (2019.01); *G06F 16/2365* (2019.01); *H03M 7/3059* (2013.01)

(58) Field of Classification Search
None
See application file for complete search history.

(56) References Cited

U.S. PATENT DOCUMENTS

| | | | |
|---|---|---|---|
| 2012/0130965 A1* | 5/2012 | Oh ...................... | H03M 7/3088 707/693 |
| 2013/0202266 A1* | 8/2013 | Tanaka ................. | H04N 19/198 386/224 |

(Continued)

FOREIGN PATENT DOCUMENTS

| WO | WO 2014/190190 A1 | 11/2014 |
|---|---|---|
| WO | WO 2019/114655 A1 | 6/2019 |

OTHER PUBLICATIONS

Extended European Search Report in European Application No. 21179447.4, dated Dec. 7, 2021.

*Primary Examiner* — Bai D Vu
(74) *Attorney, Agent, or Firm* — Finnegan, Henderson, Farabow, Garrett & Dunner, LLP

(57) ABSTRACT

A data compression method includes: obtaining a to-be-compressed object; searching a recommendation record for a recommended compression coding rule that meets a compression rate condition, the recommendation record being configured to record a compression coding rule of a historical compressed object and corresponding compression rate information, and the historical compressed object being of a same type as the to-be-compressed object; and if the recommended compression coding rule that meets the compression rate condition is found, compressing the to-be-compressed object by using the recommended compression coding rule; and if the recommended compression coding rule that meets the compression rate condition is not found, starting a regular compression coding process to obtain estimated compression rates of a plurality of compression coding rules for the to-be-compressed object, selecting a target compression coding rule based on at least the estimated compression rates, and compressing the to-be-compressed object by using the target compression coding rule.

15 Claims, 4 Drawing Sheets

(51) Int. Cl.
*G06F 16/215* (2019.01)
*G06F 16/22* (2019.01)
*G06F 16/23* (2019.01)

(56) References Cited

U.S. PATENT DOCUMENTS

| | | |
|---|---|---|
| 2014/0347331 A1 | 11/2014 | Amit et al. |
| 2018/0367161 A1 | 12/2018 | Ki et al. |
| 2021/0173824 A1* | 6/2021 | Chen ................... G06F 16/2358 |
| 2021/0192792 A1* | 6/2021 | Baick ........................ G06T 7/11 |

* cited by examiner

DATA COMPRESSION METHOD AND APPARATUS, AND COMPUTER DEVICE

CROSS-REFERENCE TO RELATED APPLICATIONS

The present application is based upon and claims priority to Chinese Patent Application No. 202010656511.4, filed on Jul. 9, 2020, the entire content of which is incorporated herein by reference.

TECHNICAL FIELD

The present specification relates to the field of data processing technologies, and in particular, to a data compression method and apparatus, and a computer device.

BACKGROUND

Data compression can be understood as representing more information through less coding. During data compression, a proper compression coding rule needs to be selected to obtain better compression efficiency. Currently, there are increasingly more compression coding rules, and a relatively large computation cost needs to be paid to select a proper compression coding rule.

SUMMARY

According to a first aspect of the present specification, a data compression method includes: obtaining a to-be-compressed object; searching a recommendation record for a recommended compression coding rule that meets a compression rate condition, the recommendation record being configured to record a compression coding rule of a historical compressed object and corresponding compression rate information, and the historical compressed object being of a same type as the to-be-compressed object; if the recommended compression coding rule that meets the compression rate condition is found, compressing the to-be-compressed object by using the recommended compression coding rule; and if the recommended compression coding rule that meets the compression rate condition is not found, starting a regular compression coding process to obtain estimated compression rates of a plurality of compression coding rules for the to-be-compressed object, selecting a target compression coding rule based on at least the estimated compression rates, and compressing the to-be-compressed object by using the target compression coding rule.

According to a second aspect of the present specification, a data compression apparatus includes: a processor; and a memory storing instructions executable by the processor. The processor is configured to obtain a to-be-compressed object; search a recommendation record for a recommended compression coding rule that meets a compression rate condition, the recommendation record being configured to record a compression coding rule of a historical compressed object and corresponding compression rate information, and the historical compressed object being of a same type as the to-be-compressed object; if the recommended compression coding rule that meets the compression rate condition is found, compress the to-be-compressed object by using the recommended compression coding rule, and if the recommended compression coding rule that meets the compression rate condition is not found, start a regular compression coding process to obtain estimated compression rates of a plurality of compression coding rules for the to-be-compressed object, select a target compression coding rule based on at least the estimated compression rates, and compress the to-be-compressed object by using the target compression coding rule.

The technical solutions provided in embodiments of the present specification can have the following beneficial effects:

In the embodiments of the present specification, because the compression coding rule of the historical compressed object and the corresponding compression rate information are recorded in the recommendation record, the recommendation record can be searched, based on the compression rate condition, for whether a recommended compression coding rule exists. If no recommended compression coding rule exists, the regular compression coding process is started to compress the to-be-compressed object. If the recommended compression coding rule exists, the recommended compression coding rule can be directly used for compression. As such, there is no need to consume time and resources to compute a proper compression coding rule for a current to-be-compressed object, thereby significantly improving compression efficiency.

It should be understood that the general descriptions above and the detailed descriptions below are merely examples for description, and cannot limit the present specification.

BRIEF DESCRIPTION OF DRAWINGS

The accompanying drawings, which are incorporated in and constitute a part of the present specification, illustrate embodiments consistent with the present specification and, together with the specification, serve to explain the principles of the present specification.

DETAILED DESCRIPTION

Figure 1:
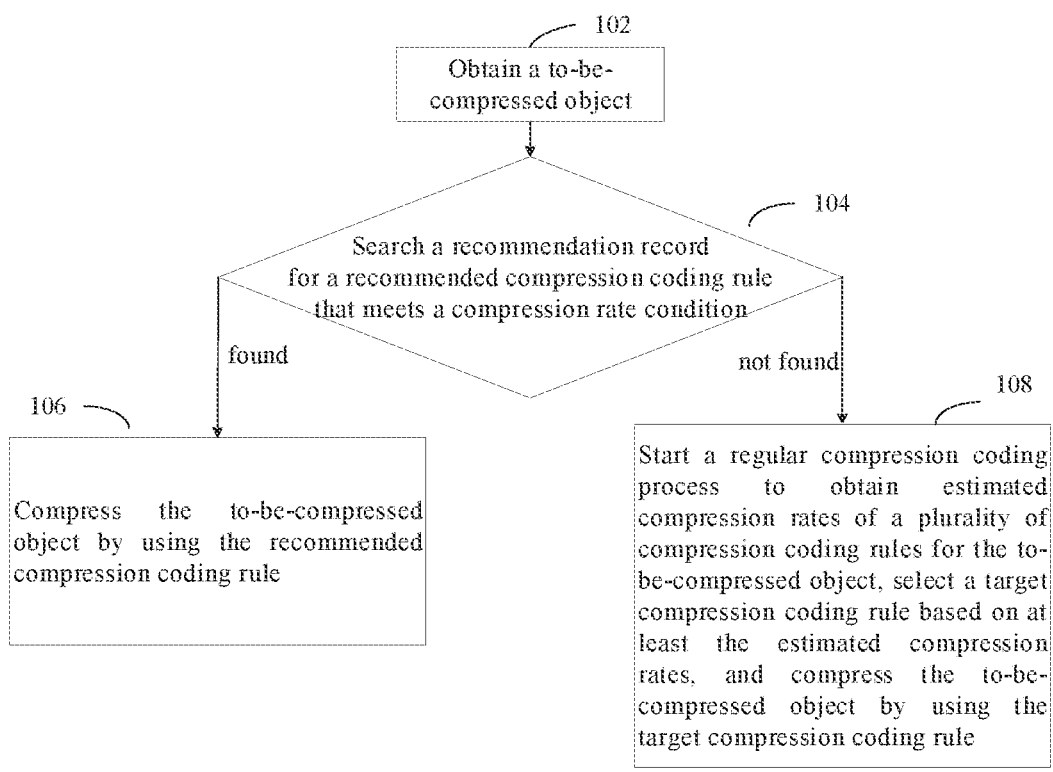
FIG. 1 is a flowchart illustrating a data compression method according to an example embodiment.

Example embodiments are described in detail herein and presented in the accompanying drawings. When the following description refers to the accompanying drawings, unless specified otherwise, same numbers in different accompanying drawings represent same or similar elements. Implementations described in the following example embodiments do not represent all implementations consistent with the present specification. On the contrary, the implementations are merely examples of apparatuses and methods that are recited in the appended claims and consistent with some aspects of the present specification.

Terms used in the present specification are merely for illustrating examples, and are not intended to limit the present specification. For example, although terms "first" and "second" may be used in the present specification to describe various types of information, the information is not limited to the terms. These terms are merely used to differentiate between information of the same type. For example, without departing from the scope of the present specification, first information can also be referred to as second information, and similarly, second information can be referred to as first information. Depending on the context, for example, the word "if" used herein can be explained as "while," "when," or "in response to determining."

For a relational database, data query processing and data storage are two core elements. Generally, more central processing unit (CPU) and memory resources need to be consumed for data query processing, and data storage mainly consumes resources of storage hardware such as a disk. However, development of the storage hardware currently does not keep pace with development of other system hardware. Currently, a space growth speed of the storage hardware fails to keep up with a storage requirement that a user wants to store a wider range of data for longer time. In addition, an access delay of the storage hardware currently lags behind a CPU and a memory by at least one order of magnitude. The space and the access delay have become two major problems that hinder the rapid development of database storage.

To alleviate the above problems, database manufacturers in the industry actively introduce a general data compression technology, and compress data at a page/block level based on storage of each database. As such, not only occupation of storage space is greatly reduced, but also a storage access delay is improved because an amount of data input/output (IO) is decreased during scanning and query of a large range of data. However, a cost is consumption of more CPU and memory resources in a compression process and a decompression process. From the perspective of the database as a whole, the introduction of the compression technology can make overall resource use more balanced, and more demanding service requirements of the user can be met under the same hardware condition.

By compression, more information is represented through less coding. A common compression method in row-column hybrid compression of the database is to compress different data by using different coding rules based on data distribution.

A theoretical limit of data compression is corresponding information entropy, that is, if a larger amount of data information is obtained, a final data compression rate is higher. In the general data compression technology, to support more use scenarios, a sliding dictionary is generally established only for byte stream for coding compression, and a specific range of context information is used. However, the relational database naturally has more background knowledge for data in the database. For example, a type of a data column can be used to predict value range distribution of data, and data in the same column has stronger clustering. Therefore, increasingly more database manufacturers split data based on a compression unit, a column storage format is used for storage inside each compression unit, and a context relationship in a column and a data relationship between columns are used to find the most matching coding rule for compression, for example, dictionary coding, run-length coding, and incremental coding. Compared with general compression, these coding rules can provide higher compression rates by using embedded-in data information, and using embedded-in storage formats also enables the database to perform query directly based on coded data. For example, for a database of a log-structured merge-tree (LSM tree) architecture, because stored data needs to be continuously compacted, and a compaction operation involves overall rewriting of the data, row-column hybrid coding compression can be naturally added to a data reshuffling process.

Although a higher compression rate can be brought when the database internally supports row-column hybrid coding compression, a complex problem of selecting and detecting a compression coding rule is accompanied. The database needs to traverse column data in all compression units to extract summary data, evaluate a final compression size based on different compression rules, and determine a finally selected coding rule. The entire coding rule detection process needs to consume a large amount of precomputation and matching comparison. In addition, currently, the compression coding rule is generally detected only for all data contexts in the same compression unit. Once a range is extended, detection complexity exponentially increases.

Coding compression of database is basically implemented based on a row-column hybrid storage mode. A specific number of data record tuples are selected as an overall compression unit, and all data in the compression unit is stored by columns. The database performs traversal scanning on each column of data to obtain basic distribution and a data feature of the column of data, and then selects a proper rule for coding compression based on a specific data feature. Different databases respectively implement different coding compression rules. Generally, dictionary coding, run-length coding, incremental coding, numeric coding, and partial open-source general compression coding are basically included. In the present implementation, a speed of selecting the compression coding rule is relatively slow. Before determining a compression coding rule that is finally selected for a column of data, the database needs to undergo several stages: data scanning analysis, precomputation of compression rates of different coding rules, coding rule selection, and data compression. A relatively large computation cost needs to be paid in each stage.

In view of this, embodiments of the present specification provide a data compression solution. The solution relates to a recommendation record used to record a compression coding rule of a historical compressed object and corresponding compression rate information. The historical compressed object is of the same type as a to-be-compressed object. Therefore, in the embodiments of the present specification, when the to-be-compressed object is compressed, the recommendation record can be first searched, based on a compression rate condition, for whether a proper compression coding rule exists. If no proper compression coding rule exists, a regular compression coding process is started to compress the to-be-compressed object. If the proper compression coding rule exists, the compression coding rule can be directly used for compression. As such, there is no need to consume time and resources to compute a proper compression coding rule for a current to-be-compressed object, thereby significantly improving compression efficiency.

FIG. 1 is a flowchart illustrating a data compression method according to an example embodiment. The method includes the following steps.

Step 102: Obtain a to-be-compressed object.

Step 104: Search a recommendation record for a recommended compression coding rule that meets a compression rate condition, the recommendation record being configured to record a compression coding rule of a historical compressed object and corresponding compression rate information, and the historical compressed object being of a same type as the to-be-compressed object.

Step 106: If the recommended compression coding rule that meets the compression rate condition is found, compress the to-be-compressed object by using the recommended compression coding rule.

Step 108: If the recommended compression coding rule that meets the compression rate condition is not found, start a regular compression coding process to obtain estimated compression rates of a plurality of compression coding rules for the to-be-compressed object, select a target compression coding rule based on at least the estimated compression rates, and compress the to-be-compressed object by using the target compression coding rule.

The present implementation is applicable to various data compression scenarios, and the to-be-compressed object can be various types of objects such as a data table, a video file, an audio file, or an image, which are not limited in the embodiment. The historical compressed object is an object that is of the same type as the to-be-compressed object and that has been compressed before the to-be-compressed object is compressed. For different to-be-compressed objects, that the historical compressed object is of the same type as the to-be-compressed object can have a plurality of implementations. For example, the to-be-compressed object and the historical compressed object can be data that is generated at different times and that is of different versions, e.g., a program source file. Also for example, the to-be-compressed object and the historical compressed object can be data in the same format, e.g., data in a video format. As another example, the to-be-compressed object and the historical compressed object can be child data that belongs to the same parent data, e.g., a plurality of pieces of child data obtained by splitting original data, or a plurality of data units that belong to the same data table.

For example, assume that to-be-compressed object Data-A1 currently needs to be compressed. In the first time of compression, no historical compressed object that is of the same type as the to-be-compressed object can be used for reference, the recommendation record is empty, and no recommended compression coding rule that meets the compression rate condition exists. As such, the regular compression coding process is started to obtain the estimated compression rates of the plurality of compression coding rules for the to-be-compressed object, the target compression coding rule is selected based on at least the estimated compression rates, and the to-be-compressed object is compressed by using the selected target compression coding rule.

After the first time of compression is completed, the recommendation record is updated based on a compression coding rule used for to-be-compressed object Data-A1. For example, the current compression can be recorded in the recommendation record. Also for example, the target compression coding rule and compression rate information of the target compression coding rule can be written in the recommendation record. In some examples, an estimated compression rate of the compression coding rule on the to-be-compressed object is not much different from an actual compression rate, and the compression rate information can be information related to the estimated compression rate. In some other examples, the estimated compression rate of the compression coding rule on the to-be-compressed object may be different from an actual compression rate to a degree. The actual compression rate may be lower than the estimated compression rate or higher than the estimated compression rate. Therefore, in the present implementation, the actual compression rate of the to-be-compressed object can be further obtained, and the recommendation record is updated based on at least the actual compression rate and the compression coding rule used for the to-be-compressed object. In this case, the compression rate information can be information related to the actual compression rate. The actual compression rate can be obtained through computation after Data-A1 is compressed, for example, the actual compression rate is determined based on a ratio of an actual size of the to-be-compressed object after compression to an original size of the to-be-compressed object. The compression rate information can be directly a value of a compression rate, or can be related information obtained by converting a compression rate by using a specified method as required.

Subsequently, because new data is inserted into Data-A1 or for another reason, new Data-A2 is generated based on Data-A1. In the current compression process, Data-A2 is used as a new to-be-compressed object, and Data-A2 is of the same type as Data-A1. For a process of using Data-A1 as the historical compressed object, references can be made to the compression process of Data-A1.

In a compression process of Data-A2, a compression coding rule can be selected with reference to compression of Data-A1. For example, the compression coding rule for compressing Data-A1 and corresponding compression rate information are recorded in the recommendation record, and it can be determined, based on the compression rate condition, whether to select the compression coding rule of Data-A1 for coding. If the compression coding rule of Data-A1 is selected, Data-A2 can be directly compressed by using the compression coding rule. The compression rate condition in the present implementation can be flexibly configured as required. For example, some to-be-compressed objects have a specific requirement on the compression rate, and different compression coding rules achieve different compression effects for the compressed object. In the present implementation, the compression rate condition can be set to select a proper recommended compression coding rule. For example, the compression rate condition can include: compression rate information of the recommended compression coding rule is higher than a specified threshold. A specific threshold can be flexibly configured based on actual needs. No limitation is imposed in the present implementation.

In the compression process of Data-A2, because the compression coding rule of the historical compressed object can be selected for compression, there is no need to consume time and resources to compute a proper compression coding rule for a current to-be-compressed object, thereby significantly improving compression efficiency.

If the compression coding rule of Data-A1 does not meet the compression rate condition of Data-A2, the regular compression coding process can also be stated for Data-A2 to obtain the estimated compression rates of the plurality of compression coding rules for the to-be-compressed object, the target compression coding rule is selected based on at least the estimated compression rates, and the to-be-compressed object is compressed by using the target compression coding rule.

After Data-A2 is compressed, the recommendation record can be further updated based on compression of Data-A2. For example, the compression coding rule of original Data-A1 may not be applicable to Data-A2 because new data is inserted into Data-A1. Therefore, in the present implementation, an actual compression rate of Data-A2 can be obtained, and the recommendation record is updated based on at least the actual compression rate and the compression coding rule used for Data-A2. For example, the recommendation record is updated to the compression coding rule used for Data-A2, and the compression rate information is updated based on the actual compression rate of Data-A2.

In an example compression service scenario, a problem of a large amount of to-be-compressed data may exist. Therefore, the to-be-compressed data can be split into a plurality of to-be-compressed data units as required. In the service scenario, the data compression method in the present implementation can be used to better improve compression efficiency. For example, the to-be-compressed object can include to-be-compressed data units obtained by splitting to-be-compressed data, and the historical compressed object includes other historical compressed data units obtained by splitting the to-be-compressed data.

Figure 2:
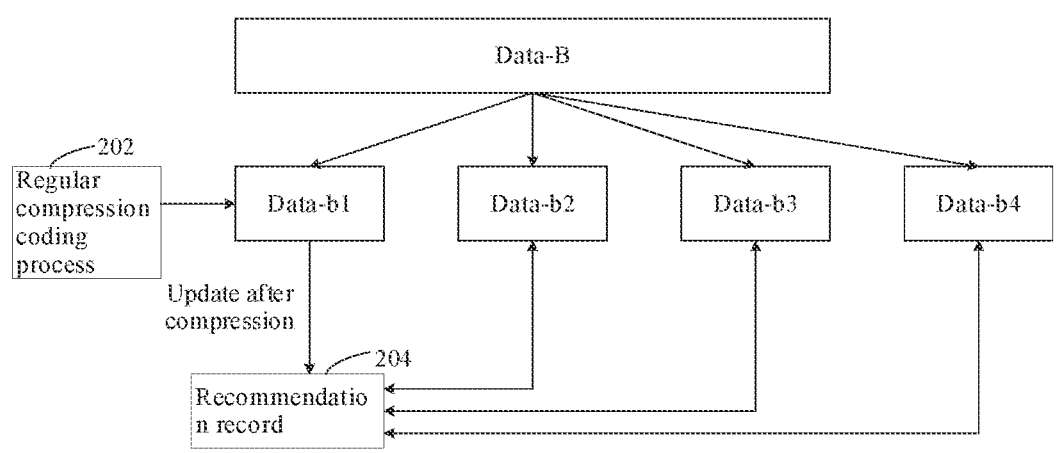
FIG. 2 is a schematic diagram illustrating a data compression method according to an example embodiment.

For example, as shown in FIG. 2, Data-B can be split into a total of four to-be-compressed data units Data-b1, Data-b2, Data-b3, and Data-b4.

Also for example, for Data-b1, in the first time of compression, no historical compressed object can be used for reference, a recommendation record is empty, and no recommended compression coding rule that meets a compression rate condition exists. As such, a regular compression coding process 202 is started to obtain estimated compression rates of a plurality of compression coding rules for the to-be-compressed object, a target compression coding rule is selected based on at least the estimated compression rates, and the to-be-compressed object is compressed by using the selected target compression coding rule.

After the first time of compression is completed, the current compression can be recorded in a recommendation record 204. For example, the target compression coding rule and compression rate information of the target compression coding rule are recorded in the recommendation record 204. Subsequently, in a compression process of Data-b2, a compression coding rule can be selected with reference to compression of Data-b1. For example, the compression coding rule for compressing Data-b1 and corresponding compression rate information are recorded in the recommendation record 204, and it can be determined, based on the compression rate condition, whether to select the compression coding rule of Data-b1 for coding. If the compression coding rule of Data-b1 is selected, Data-b2 can be directly compressed by using the compression coding rule. After Data-b2 is compressed, it is determined, based on compression, whether to update the recommendation record 204. Subsequently, for Data-b3 and Data-b4, the same process can also be used to implement fast compression and update the recommendation record 204.

In some other examples, a compression scenario of a data table is used as an example. In a distributed relational database of an LSM tree architecture, etc., a data table may undergo compaction a plurality of times, and new data obtained each time of compaction needs to be compressed. Using the solution in the present implementation of the present specification, there is no need to repeatedly estimate compression rates of a plurality of compression coding rules, and the recommendation record can be constructed by using a compression knowledge of the historical compressed object. In subsequent other compression processes, a compression coding rule can be quickly obtained based on the recommendation record.

For example, to-be-compressed data in tableC currently needs to be compressed. Because there is a large amount of to-be-compressed data in tableC, the to-be-compressed data in tableC is split into a total of five to-be-compressed data units from table-c1 to table-c5 based on a specified data unit size.

For table-c1, in the first time of compression, no historical compressed object can be used for reference, and a recommendation record is empty. As such, a regular compression coding process is started to obtain estimated compression rates of a plurality of compression coding rules for the to-be-compressed object, a target compression coding rule is selected based on at least the estimated compression rates, and the to-be-compressed object is compressed by using the selected target compression coding rule.

After the first time of compression is completed, the current compression can be recorded in the recommendation record. For example, the target compression coding rule and compression rate information of the target compression coding rule are recorded in the recommendation record. Subsequently, in a compression process of table-c2, a compression coding rule can be selected with reference to compression of table-c1. For example, the compression coding rule for compressing table-c1 and corresponding compression rate information are recorded in the recommendation record, and it can be determined, based on the compression rate condition, whether to select the compression coding rule of table-c1 for coding. If the compression coding rule of table-c1 is selected, table-c2 can be directly compressed by using the compression coding rule. After table-c2 is compressed, it is determined, based on compression, whether to update the recommendation record. Subsequently, for table-c3 and table-c4, the same process can also be used to implement fast compression and update the recommendation record.

In some other examples, a data table generally includes a plurality of columns of data having different attributes, the columns of data may vary greatly, and different compression coding rules can be used for different columns of data in the data table. For example, in a user data table, a column of data about a user age is integer data, and a column of data about a user name is string data. A proper compression coding rule can be selected for each of the two columns of data. Based on this, the to-be-compressed object in the present implementation can include a column of to-be-compressed data in a data table, and the historical compressed object can include historical compressed data in the same column as the column of to-be-compressed data in the data table. Based on this, in the present implementation, column data can be distinguished. A compression coding rule recorded in the recommendation record corresponds to the column data. After a certain column of data in the data table is compressed, when the column of data in the data table subsequently needs to be compressed after the column of data is updated, the column of data can be compressed based on a compression coding rule of historical compressed data in the same column in the data table, thereby improving compression efficiency.

In some other examples, the to-be-compressed object includes a duplicate of a data table, and the historical compressed object includes a main data table corresponding to the duplicate of the data table.

Similar to the examples above, the duplicate of the data table includes the same content as the main data table, and the duplicate of the data table is consistent with the main data table. Generally, after the main data table is updated, the duplicate of the data table is updated based on the update operation of the main data table. If the main data table involves compression storage after update, compression storage also needs to be performed for the duplicate of the data table after update. Based on this, in a compression process of the duplicate of the data table, the duplicate of the data table can be directly compressed by using a compression coding rule of the main data table. In an example, when the duplicate of the data table is compressed, the recommendation record is searched for the compression coding rule of the main data table and corresponding compression rate information, and the compression coding rule of the main data table is directly used for compression. In another example, a compression rate of the compression coding rule selected for the main data table may not be high. When the recommendation record is searched, it can be determined, as required, that no recommended compression coding rule that meets the compression rate condition exists in the recommendation record, to start a regular compression coding process to compress the duplicate of the data table.

In an example, there may be a single evaluation standard of the compression coding rule. The compression coding rule is mainly selected based on the final actual compression rate, without comprehensively considering additional overheads brought by different compression coding rules for different data access modes in case of actual database service load. For example, assume that a data compression rate is relatively high. In this case, a corresponding data decompression process consumes more time because a compression rate is negatively correlated with decompression efficiency. If data needs to be accessed frequently, a data compression rate is relatively high, and the data needs to be decompressed in each time of access, relatively large additional decompression overheads may be inevitable. Based on this, in the present implementation, access requirement information of the to-be-compressed object is obtained. The access requirement information can be related to decompression efficiency. For example, a higher access requirement indicates higher corresponding decompression efficiency. The access requirement information can be configured by a service party, can be configured by a data access party, or can be determined by collecting historical access data of one or more of the to-be-compressed object or the historical compressed object. For example, assume that the historical compressed object is frequently accessed. In this case, a data access requirement is relatively high, and a corresponding decompression efficiency requirement is relatively high. Based on this, a relatively high access requirement can be set. If the historical compressed object is rarely accessed, a data access requirement is relatively low, and a corresponding decompression efficiency requirement is relatively low. Based on this, a relatively low access requirement can be set. In an example, historical access information of the to-be-compressed object can be obtained based on the historical compressed data of the same type as the to-be-compressed object. In another example, the historical access information can include an operation type of the data, for example, adding, deleting, modifying, or query, or can be the number of operations performed on the data within a specific time period, or can be a historical access frequency.

Correspondingly, the compression rate condition includes: the compression rate information of the recommended compression coding rule matches the access requirement information, so that a proper compression coding rule can be selected based on a compression rate requirement and the access requirement information, instead of only a single factor such as the compression rate, and final compressed data can further meet the access requirement of the service.

Based on this, when the access requirement information is obtained, the recommendation record can be further updated based on the actual compression rate, the access requirement information, and the compression coding rule used for the to-be-compressed object. For example, in an initial stage of compression, the compression coding rule used for the to-be-compressed object starts to be written into in the recommendation record. Subsequently, as content of the to-be-compressed data changes or access of the to-be-compressed data changes, the compression coding rule used for the to-be-compressed object may subsequently change. Based on this, the recommendation record needs to be updated dynamically. In an example, the compression rate information of the compression coding rule is implemented by using a confidence level, and the confidence level represents the actual compression rate of the compression coding rule, so that reliability of the compression coding rule can be dynamically adjusted in a continuous compression process. In another example, the updating the compression coding rule and the corresponding compression rate information in the recommendation record based on the actual compression rate and the access requirement information in the present implementation can include: if the compression coding rule used for the to-be-compressed object is a recommended compression coding rule recorded in the recommendation record, and the actual compression rate of the to-be-compressed object matches the access requirement information, increasing a confidence level of the recommended compression coding rule; otherwise, reducing a confidence level of the recommended compression coding rule; or if the compression coding rule used for the to-be-compressed object is different from a recommended compression coding rule recorded in the recommendation record, and the actual compression rate of the to-be-compressed object matches the access requirement information, replacing the recommended compression coding rule in the recommendation record with the compression coding rule used for the to-be-compressed object.

In the above implementation, when the to-be-compressed object is compressed by using the recommended compression coding rule recorded in the recommendation record, after compression ends, whether the recommended compression coding rule is proper is checked by using the actual compression rate and the access requirement information. If the actual compression rate of the to-be-compressed object matches the access requirement information, the confidence level of the recommended compression coding rule is increased, so that the compression coding rule can be continued to use in subsequent compression. Otherwise, the confidence level of the recommended compression coding rule is reduced, so that when the confidence level of the recommended compression coding rule is lower than a threshold, the regular compression coding process can be started to obtain a new compression coding rule. If there is no proper compression coding rule in the recommendation record, the regular compression coding process is started to obtain a new compression coding rule. The new compression coding rule is different from the recommended compression coding rule recorded in the recommendation record. Similarly, after compression ends, whether the recommended compression coding rule is proper is checked by using the actual compression rate and the access requirement information. If the actual compression rate of the to-be-compressed object matches the access requirement information, the recommended compression coding rule in the recommendation record can be replaced with the compression coding rule used for the to-be-compressed object, so that newest proper compression coding rule can be recorded in the recommendation record for use in subsequent compression. If the actual compression rate of the to-be-compressed object does not match the access requirement information, the compression coding rule is not applicable, and the recommendation record may not be updated.

In a distributed database of an LSM tree architecture, etc., relatively more data compaction requirements exist. A relational database of the LSM tree architecture is used as an example. The LSM tree has a multi-layer structure similar to a tree structure where a data amount at an upper layer is smaller than a data amount at a lower layer. First, a C0 layer resident in memory stores all recently written data tuple records. The memory structure is orderly, can implement in-place update at any time, and can be queried at any time. The remaining C1 to Cn layers are all resident on disk.

A data write process may be as follows: When a data write operation comes, the data write operation is first added to a write-ahead log (that is, a log recorded before actual writing), and then added to the C0 layer. When data at the C0 layer reaches a specific size, the C0 layer and the C1 layer are compacted. This is similar to merge sort. The process is compaction. Data at a new-C1 layer obtained through compaction is sequentially written into the disk to replace the original old-C1 layer. When the C1 layer reaches a specific size, compaction with a lower layer continues. After compaction, all old files can be deleted, and new files are left.

In the implementation, when compaction is performed, data needs to be reshuffled and rewritten into a new storage file, and the new storage file needs to be compressed.

During compaction and writing, data is split into independent compression units based on a fixed size specified when the user creates a table, and row-column hybrid coding compression is performed on data in each compression unit.

In addition, in a distributed database scenario, each data table has a plurality of data duplicates. Compaction times of the main data table and the duplicate of the data table may be staggered to alternately provide a service to ensure service access availability and stability of the user.

For example, a statistical information module configured in a database can obtain access data of a home table. An access requirement of the data table can be quickly determined based on the access data. For example, a larger number of data point query operations and a larger number of data table access times indicate a higher access delay requirement of the data table based on an operation type of historical access and a historical access frequency. Storage resources saved by compressing the data cannot compensate for additional computing resource overheads, and a compression coding rule with a relatively low compression rate needs to be used, to ensure an access speed of the user. A lower number of data point query operations and a lower number of data table access times indicate that the user does not perform query much and has a lower access delay requirement. In this case, a compression rule with a relatively high compression rate can be used.

In a compaction process of a data table, a large number of data units need to be compressed, and a recommendation record that includes a current best compression coding rule is maintained. After a compression coding rule is selected for the to-be-compressed object for compression each time, compression of the compression coding rule is updated to the recommendation record, which may be implemented as a library, and a newest compression coding rule in a current state is maintained in the recommendation record.

In an example, before each to-be-compressed data unit is compressed, the data table accepts two pieces of input information: access requirement information of the data table and a newest recommendation record.

When the recommendation record is empty or a confidence level of the compression coding rule in the recommendation record does not reach a specified threshold, a regular compression coding process is started to detect a to-be-compressed data unit. Data feature analysis is performed on each column of data by using the regular compression coding process. Compression rates are sorted based on estimated compression rates of different compression coding rules. A compression coding rule that meets the access requirement of the data table is finally selected, as a compression coding rule used for current compression, from the plurality of compression coding rules with different estimated rates based on the access requirement information of data table. The to-be-compressed data unit may include a plurality of columns of different types of data. A corresponding compression coding rule can be selected for each column of data, that is, the to-be-compressed data unit can correspond to two or more compression coding rules.

When a confidence level of the compression coding rule in the recommendation record exceeds a specified threshold, the compression coding rule in the recommendation record can be directly used as a compression coding rule used for a current to-be-compressed data unit. The to-be-compressed data unit may include a plurality of columns of different types of data, and a corresponding compression coding rule can be selected for each column of data. In some examples, compression coding rules can be selected for some data columns from the recommendation record, and some data columns cannot. In this case, a regular compression coding process can be started for detection and selection.

After one or more compression coding rules required by the current to-be-compressed data unit are selected, data in the to-be-compressed data unit is scanned by columns, and starts to be compressed by using the selected compression coding rules. After compression of each data column is completed, actual compression rate information of each data column is obtained.

After overall compression is completed for the data unit, the recommendation record is updated based on the actual compression rate information of each data column:

if the compression coding rule used for the to-be-compressed object is a recommended compression coding rule recorded in the recommendation record, and the actual compression rate of the to-be-compressed object matches the access requirement information, increasing a confidence level of the recommended compression coding rule, otherwise, reducing a confidence level of the recommended compression coding rule; or if the compression coding rule used for the to-be-compressed object is different from a recommended compression coding rule recorded in the recommendation record, and the actual compression rate of the to-be-compressed object matches the access requirement information, replacing the recommended compression coding rule in the recommendation record with the compression coding rule used for the to-be-compressed object.

For a compression process of the duplicate of the data table, data compression can be performed on the duplicate of the data table directly by using a compression coding rule of the main data table having the same data.

In the data compression method in the present implementation, a semi-supervised learning method is used, so that more historical context information is fully used to adjust the compression coding rule in the recommendation record timely.

For the main data table, in a compaction process, the regular compression coding process may be started for a to-be-compressed data unit in an earlier stage of compression to detect each compression coding rule, to obtain a newest recommendation record through training. After the confidence level exceeds the specified threshold, a subsequent to-be-compressed data unit can start to be compressed directly by using the compression coding rule in the recommendation record, and complex rule detection is not required. Because the data in the duplicate of the data table is exactly the same as that in the main data table, the duplicate of the data table can be directly compressed by using a final recommended coding rule of the main data table, so that detection overheads of all compression coding rules can be eliminated.

In the present implementation, during selection of a compression coding rule corresponding to each to-be-compressed data unit, an access requirement of a data table to which the to-be-compressed data unit belongs is optimized, and selection of a final compression coding rule is adjusted based on the access delay requirement. In addition, selection of the compression coding rule corresponding to each to-be-compressed data unit is not merely based on data in the current unit. Instead, an optimal compression coding rule is comprehensively considered by using actual compression rate results of more compression units.

The above implementation uses the data compression method for the distributed relational database of the LSM tree architecture. A semi-supervised multi-level feedback mechanism is implemented in conjunction with the row-column hybrid compression coding rule of the database. Specific selection of a compression coding rule of each data unit is corrected by using the access requirement information of the data table, and a proper compression rule can be continuously learned in the compression process to update the recommendation record, thereby accelerating coding rule selection in the entire compaction process. For the data table, a detection speed of the compression coding rule can be greatly improved based on another data duplicate in a distributed database cluster and a local historical compression data knowledge, and a proper compression coding rule is selected adaptively based on an access requirement feature of data, so that a compression rate is improved while a data access speed is improved as much as possible.

For the duplicate of the data table, the recommendation record of the main data table can be directly used, so that a rule recommendation and training process that consumes computing resources can be skipped. Generally, more context information can be fully used to accelerate and optimize detection of the compression coding rule.

Corresponding to the embodiments of the data compression method, the present specification further provides embodiments of a data compression apparatus such as a computer device. The computer device may be, for example, a server or a terminal device.

Figure 3:
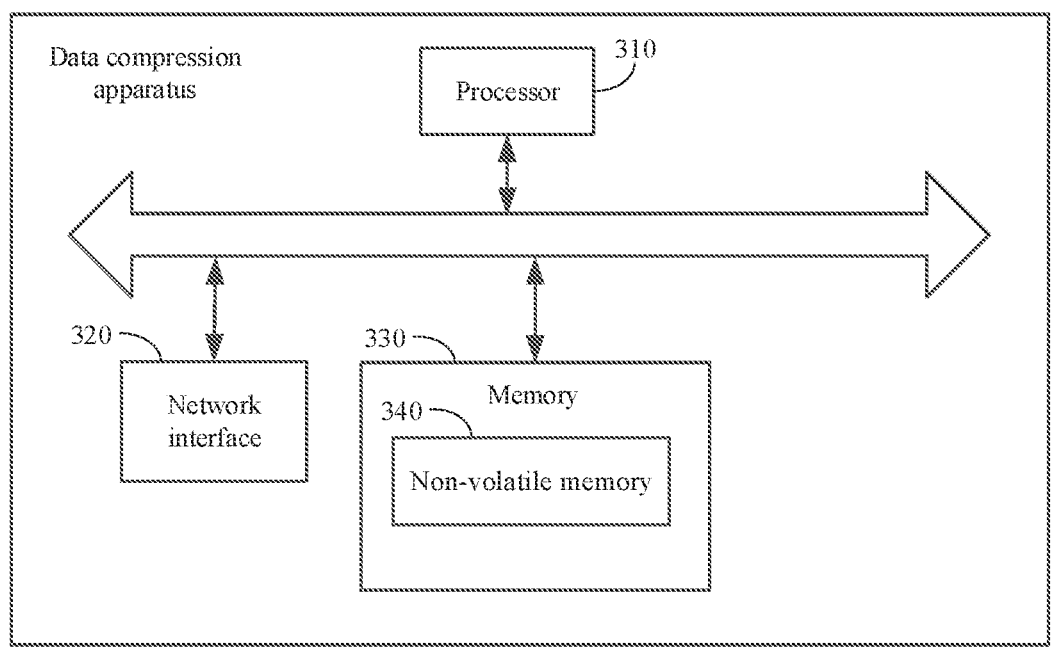
FIG. 3 is a schematic diagram illustrating a data compression apparatus according to an example embodiment.

FIG. 3 is a schematic diagram illustrating a data compression apparatus according to an example embodiment. The apparatus may include a processor 310, a network interface 320, and a memory 330 which may further include a non-volatile memory 340. The processor 310 is configured to execute instructions stored in the memory 330 to perform the data compression methods described above. For example, the apparatus may be a computer device, such as a server or an electronic device.

Figure 4:
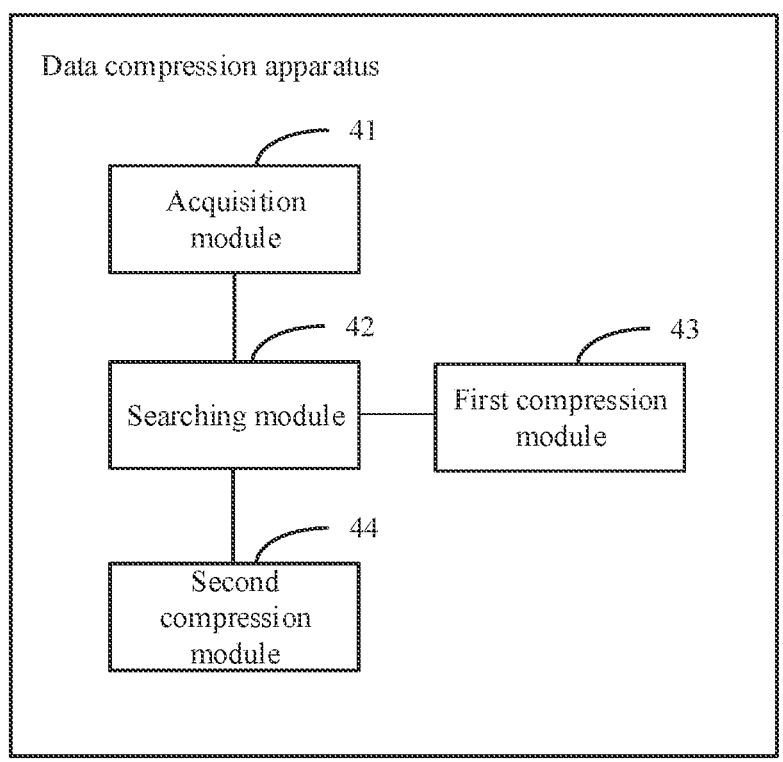
FIG. 4 is a block diagram illustrating a data compression apparatus according to an example embodiment.

FIG. 4 is a block diagram illustrating a data compression apparatus according to an example embodiment. The apparatus includes: an acquisition module 41, a searching module 42, a first compression module 43, and a second compression module 44. Each module in the apparatus can be implemented by software, hardware, or a combination of hardware and software.

The acquisition module 41 is configured to obtain a to-be-compressed object.

The searching module 42 is configured to search a recommendation record for a recommended compression coding rule that meets a compression rate condition, the recommendation record being configured to record a compression coding rule of a historical compressed object and corresponding compression rate information, and the historical compressed object being of the same type as the to-be-compressed object.

The first compression module 43 is configured to: if the recommended compression coding rule that meets the compression rate condition is found, compress the to-be-compressed object by using the recommended compression coding rule.

The second compression module 44 is configured to: if the recommended compression coding rule that meets the compression rate condition is not found, start a regular compression coding process to obtain estimated compression rates of a plurality of compression coding rules for the to-be-compressed object, select a target compression coding rule based on at least the estimated compression rates, and compress the to-be-compressed object by using the target compression coding rule.

In an embodiment, the to-be-compressed object includes to-be-compressed data units obtained by splitting to-be-compressed data, and the historical compressed object includes other historical compressed data units obtained by splitting the to-be-compressed data.

In an embodiment, the to-be-compressed object includes to-be-compressed data units obtained by splitting to-be-compressed data in a data table, and the historical compressed object includes historical compressed data units corresponding to the data table.

In an embodiment, the to-be-compressed object includes a column of to-be-compressed data in a data table, and the historical compressed object includes historical compressed data in the same column as the column of to-be-compressed data in the data table.

In an embodiment, the to-be-compressed object includes a duplicate of a data table, and the historical compressed object includes a main data table corresponding to the duplicate of the data table.

In an embodiment, the compression rate condition includes at least: compression rate information of the recommended compression coding rule is higher than a specified threshold.

In an embodiment, the apparatus further includes an update module (not shown) configured to: after the to-be-compressed object is compressed, update the recommendation record based on a compression coding rule used for the to-be-compressed object.

In an embodiment, the update module is further configured to: obtain an actual compression rate of the to-be-compressed object, and update the recommendation record based on at least the actual compression rate and the compression coding rule used for the to-be-compressed object.

In an embodiment, the acquisition module 41 is further configured to obtain access requirement information of the to-be-compressed object, where the access requirement information is related to decompression efficiency of the to-be-compressed object; and the compression rate condition includes: the compression rate information of the recommended compression coding rule matches the access requirement information.

In an embodiment, the second compression module 44 is further configured to: select the target compression coding rule based on the estimated compression rates and the access requirement information.

In an embodiment, the access requirement information of the to-be-compressed object is determined by obtaining historical access data of one or more of the to-be-compressed object or the historical compressed object.

In an embodiment, the historical access data includes a historical access frequency.

In an embodiment, the update module is further configured to: update the recommendation record based on the actual compression rate, the access requirement information, and the compression coding rule used for the to-be-compressed object.

In an embodiment, compression rate information of the compression coding rule includes a confidence level indicating the actual compression rate of the compression coding rule; and the update module is further configured to:

if the compression coding rule used for the to-be-compressed object is a recommended compression coding rule recorded in the recommendation record, and the actual compression rate of the to-be-compressed object matches the access requirement information, increase a confidence level of the recommended compression coding rule: otherwise, reduce a confidence level of the recommended compression coding rule; or if the compression coding rule used for the to-be-compressed object is different from a recommended compression coding rule recorded in the recommendation record, and the actual compression rate of the to-be-compressed object matches the access requirement information, replace the recommended compression coding rule in the recommendation record with the compression coding rule used for the to-be-compressed object.

For an implementation process of functions and roles of each module in the data compression apparatus, references can be made to an implementation process of a corresponding step in the data compression method.

Because the implementation of the data compression apparatus corresponds to the implementation of the data compression method, for related parts, references can be made to related descriptions in the method implementation. The apparatus implementation describe above is merely an example. The modules described as separate parts may or may not be physically separate, and parts displayed as modules may or may not be physical modules, may be located in one position, or may be distributed on a plurality of network modules. Some or all of the modules can be selected based on actual needs.

Example implementations of the present specification are described above. Other implementations fall within the scope of the appended claims. In some situations, the actions or steps described above can be performed in a different order. In addition, the process depicted in the accompanying drawings does not necessarily require a particular execution order to achieve the desired results. In some implementations, multi-tasking and parallel processing can be advantageous.

Other embodiments of the present specification will be apparent to one skilled in the art after consideration and practice of the present specification. The present specification is intended to cover any variation, use, or adaptation of the present specification following the general principles of the present specification and including common knowledge or conventional techniques that are not disclosed in the present specification. The specification and embodiments are merely examples, and the actual scope and the spirit of the present specification are indicated by the following claims.

It should be understood that the present specification is not limited to the precise structures that have been described above and shown in the drawings, and various modifications and changes can be made without departing from the scope of the present specification. The scope of the present specification is limited by the appended claims only.

The invention claimed is:

1. A data compression method, comprising:
   obtaining a to-be-compressed object;
   searching a recommendation record for a recommended compression coding rule that meets a compression rate condition, wherein the recommendation record is configured to record a compression coding rule of a historical compressed object and corresponding compression rate information, the historical compressed object is of a same type as the to-be-compressed object, and the compression rate condition includes a compression rate of the recommended compression coding rule being higher than a specified threshold; and
   when the recommended compression coding rule that meets the compression rate condition is not found, starting a regular compression coding process to obtain estimated compression rates of a plurality of compression coding rules for the to-be-compressed object, selecting a target compression coding rule based on at least the estimated compression rates, and compressing the to-be-compressed object by using the target compression coding rule, wherein the estimated compression rate of each of the plurality of compression coding rules is determined based on a ratio of a size of the to-be-compressed object after compression by the regular compression coding process to an original size of the to-be-compressed object.

2. The method according to claim 1, wherein the to-be-compressed object includes to-be-compressed data units obtained by splitting to-be-compressed data, and the historical compressed object includes historical compressed data units obtained by splitting the to-be-compressed data.

3. The method according to claim 1, wherein the to-be-compressed object includes to-be-compressed data units obtained by splitting to-be-compressed data in a data table, and the historical compressed object includes historical compressed data units corresponding to the data table.

4. The method according to claim 1, wherein the to-be-compressed object includes a column of to-be-compressed data in a data table, and the historical compressed object includes historical compressed data in the same column as the column of to-be-compressed data in the data table.

5. The method according to claim 1, wherein the to-be-compressed object includes a duplicate of a data table, and the historical compressed object includes a main data table corresponding to the duplicate of the data table.

6. The method according to claim 1, further comprising:
   after compressing the to-be-compressed object, updating the recommendation record based on a compression coding rule used for the to-be-compressed object.

7. The method according to claim 6, wherein the updating the recommendation record based on the compression coding rule used for the to-be-compressed object includes:
   obtaining an actual compression rate of the to-be-compressed object, and updating the recommendation record based on at least the actual compression rate and the compression coding rule used for the to-be-compressed object.

8. The method according to claim 1, further comprising:
   obtaining access requirement information of the to-be-compressed object, wherein the access requirement information is related to decompression efficiency of the to-be-compressed object; and the compression rate condition includes: the compression rate information of the recommended compression coding rule matches the access requirement information.

9. The method according to claim 8, wherein the selecting the target compression coding rule based on at least the estimated compression rates includes:
selecting the target compression coding rule based on the estimated compression rates and the access requirement information.

10. The method according to claim 8, wherein the access requirement information of the to-be-compressed object is determined by obtaining historical access data of one or more of the to-be-compressed object or the historical compressed object.

11. The method according to claim 10, wherein the historical access data includes a historical access frequency.

12. The method according to claim 8, wherein the updating the recommendation record based on at least the actual compression rate and the compression coding rule used for the to-be-compressed object includes:
updating the recommendation record based on the actual compression rate, the access requirement information, and the compression coding rule used for the to-be-compressed object.

13. The method according to claim 12, wherein compression rate information of the compression coding rule includes a confidence level indicating the actual compression rate of the compression coding rule; and the updating the recommendation record based on the actual compression rate, the access requirement information, and the compression coding rule used for the to-be-compressed object includes:
in response to the compression coding rule used for the to-be-compressed object being a recommended compression coding rule recorded in the recommendation record, and the actual compression rate of the to-be-compressed object matches the access requirement information, increasing a confidence level of the recommended compression coding rule; otherwise, reducing a confidence level of the recommended compression coding rule.

14. The method according to claim 12, wherein the updating the recommendation record based on the actual compression rate, the access requirement information, and the compression coding rule used for the to-be-compressed object includes:
in response to the compression coding rule used for the to-be-compressed object being different from a recommended compression coding rule recorded in the recommendation record, and the actual compression rate of the to-be-compressed object matching the access requirement information, replacing the recommended compression coding rule in the recommendation record with the compression coding rule used for the to-be-compressed object.

15. A data compression apparatus, comprising:
a processor; and
a memory storing instructions executable by the processor,
wherein the processor is configured to:
obtain a to-be-compressed object;
search a recommendation record for a recommended compression coding rule that meets a compression rate condition, wherein the recommendation record is configured to record a compression coding rule of a historical compressed object and corresponding compression rate information, the historical compressed object is of a same type as the to-be-compressed object, and the compression rate condition includes a compression rate of the recommended compression coding rule being higher than a specified threshold; and
when the recommended compression coding rule that meets the compression rate condition is not found, start a regular compression coding process to obtain estimated compression rates of a plurality of compression coding rules for the to-be-compressed object, select a target compression coding rule based on at least the estimated compression rates, and compress the to-be-compressed object by using the target compression coding rule, wherein the estimated compression rate of each of the plurality of compression coding rules is determined based on a ratio of a size of the to-be-compressed object after compression by the regular compression coding process to an original size of the to-be-compressed object.

* * * * *